United States Patent
Nam et al.

(10) Patent No.: US 11,342,204 B2
(45) Date of Patent: May 24, 2022

(54) METHOD AND APPARATUS FOR CLEANING SEMICONDUCTOR WAFERS

(71) Applicant: XIA TAI XIN SEMICONDUCTOR (QING DAO) LTD., Qingdao (CN)

(72) Inventors: Chang-Hyeon Nam, Singapore (SG); Injoon Yeo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 176 days.

(21) Appl. No.: 16/668,395

(22) Filed: Oct. 30, 2019

(65) Prior Publication Data

US 2020/0203193 A1    Jun. 25, 2020

(51) Int. Cl.
```
B08B 3/08       (2006.01)
B08B 7/00       (2006.01)
B08B 7/04       (2006.01)
H01L 21/67      (2006.01)
H01L 21/677     (2006.01)
H01L 21/687     (2006.01)
F26B 21/14      (2006.01)
H01L 21/02      (2006.01)
```
(52) U.S. Cl.
CPC .......... *H01L 21/67057* (2013.01); *B08B 3/08* (2013.01); *B08B 7/0021* (2013.01); *B08B 7/04* (2013.01); *F26B 21/14* (2013.01); *H01L 21/02057* (2013.01); *H01L 21/02101* (2013.01); *H01L 21/67034* (2013.01); *H01L 21/67766* (2013.01); *H01L 21/67781* (2013.01); *H01L 21/68707* (2013.01)

(58) Field of Classification Search
CPC ......... H01L 21/67057; H01L 21/67034; H01L 21/67781; H01L 21/67766; H01L 21/68707; H01L 21/02101; H01L 21/02057; H01L 21/67757; H01L 21/67028; H01L 21/67173; H01L 21/67051; H01L 21/67276; F26B 21/14; B08B 3/08; B08B 7/0021; B08B 7/04
See application file for complete search history.

(56) References Cited

U.S. PATENT DOCUMENTS

| | | | | |
|---|---|---|---|---|
| 5,547,515 A | * | 8/1996 | Kudo | H01L 21/67028 134/21 |
| 5,887,602 A | * | 3/1999 | Iwama | H01L 21/67057 134/43 |
| 6,637,446 B2 | * | 10/2003 | Frost | H01L 21/67028 134/184 |
| 2001/0004899 A1 | * | 6/2001 | Yokomizo | H01L 21/67051 134/2 |

(Continued)

*Primary Examiner* — Alexander Markoff
(74) *Attorney, Agent, or Firm* — ScienBiziP, P.C.

(57) ABSTRACT

The present disclosure provides a method and a cleaning apparatus for cleaning semiconductor wafers. The cleaning apparatus includes a plurality of cleaning tanks, a dipping tank, a first robot hand, a second robot hand, and at least one drying chamber. The plurality of cleaning tanks is configured to clean a plurality of wafers held by a cassette by cleaning agents. The plurality of wafers is cleaned in the plurality of cleaning tanks through a batch process. The dipping tank is configured to rinse the plurality of wafers by a replacement agent. The at least one drying chamber is configured to dry the wafer taken by the second robot hand with single wafer process.

9 Claims, 7 Drawing Sheets

(56) References Cited

U.S. PATENT DOCUMENTS

| | | | |
|---|---|---|---|
| 2003/0177659 A1* | 9/2003 | Saito | H01L 21/67034 |
| | | | 34/330 |
| 2006/0137726 A1* | 6/2006 | Sano | H01L 21/67766 |
| | | | 134/61 |
| 2012/0118332 A1* | 5/2012 | Sato | H01L 21/67034 |
| | | | 134/30 |
| 2012/0308346 A1* | 12/2012 | Keigler | H01L 21/67034 |
| | | | 414/222.09 |
| 2013/0312659 A1* | 11/2013 | Inatomi | H01L 21/67028 |
| | | | 118/66 |
| 2014/0182626 A1* | 7/2014 | Hayashi | H01L 21/67028 |
| | | | 134/18 |
| 2015/0332940 A1* | 11/2015 | Wang | H01L 21/67781 |
| | | | 134/25.1 |
| 2017/0110317 A1* | 4/2017 | Zhang | H01L 21/02057 |
| 2019/0057890 A1* | 2/2019 | Sato | H01L 21/67253 |
| 2019/0103294 A1* | 4/2019 | Masutomi | H01L 21/6708 |
| 2021/0249257 A1* | 8/2021 | Wang | H01L 21/67742 |

\* cited by examiner

METHOD AND APPARATUS FOR CLEANING SEMICONDUCTOR WAFERS

CROSS-REFERENCE TO RELATED APPLICATION

This application claims the benefit of and priority to U.S. Provisional Patent Application No. 62/779,496 filed on Dec. 14, 2018, the contents of which are incorporated by reference herein.

FIELD

The present disclosure relates to a method and apparatus for cleaning semiconductor wafers. More specifically, the present disclosure relates to a method and apparatus that combines batch process and single wafer process together for cleaning semiconductor wafers.

BACKGROUND

During an integrated circuit fabrication process, a wet cleaning process is essential for obtaining high quality integrated circuits. After a dry etching process, a wafer is cleaned to remove residual photoresist, organic compounds generated during the dry etching process, and film materials attached on the surface of the wafer. The main chemical solution for cleaning the wafer includes, for example, Standard Clean 1 (SC1), Buffered Oxide Etch (BOE) and Sulfuric Peroxide Mixture (SPM; which is a mixture of $H_2SO_4$ and $H_2O_2$). The temperature of SPM is higher than 90° C., and the SPM is used for removing the residual photoresist and organic compounds. Generally, there are two ways to clean the wafer in the industry. One is batch cleaning and the other is single wafer cleaning.

The batch cleaning cleans a plurality of wafers at once. An apparatus for the batch cleaning includes mechanical transferring devices and several cleaning tanks. A plurality of wafers can be cleaned in one of the cleaning tanks simultaneously, so the efficiency of the batch cleaning is high (e.g., about four hundred wafers can be cleaned per hour). However, the batch cleaning process usually employs more cleaning tanks (for supporting multiple sequential dipping cycles) to facilitate the cleanness requirement of the wafer.

The single wafer cleaning only cleans a piece of wafer at a time. An apparatus of the single wafer cleaning includes mechanical transferring devices and several independent single wafer cleaning modules. The cleaning and drying processes for one wafer are performed in one of the single wafer cleaning modules. After cleaning a piece of wafer, the chemical solution in the single wafer cleaning module is drained and new chemical solution is supplied to the single wafer cleaning module to clean another piece of wafer (for avoiding cross contamination). The single wafer cleaning can effectively remove particles and film material, but the processing rate (i.e., unit per equipment hours; UPEH) of the single wafer cleaning is relatively slow compared to the batch cleaning.

Accordingly, there is a need to provide a cleaning system having both improved processing rate and cleaning performance for wafer cleaning process.

SUMMARY

In view of above, the present disclosure is directed to a method and an apparatus for cleaning semiconductor wafers.

An implementation of the present disclosure is directed to a method of cleaning semiconductor wafers. The method includes actions S601 to S612. In action S601, a cassette holding a plurality of wafers is loaded to a cleaning apparatus. The cleaning apparatus includes a plurality of cleaning tanks, a dipping tank, and at least one drying chamber. The plurality of cleaning tanks are configured to accommodate cleaning agents for cleaning the wafers. The plurality of cleaning tanks include a first tank configured to accommodate a $H_3PO_4$ solution or a low ammonium fluoride liquid (LAL) solution, a second tank configured to accommodate deionized (DI) water, a third tank configured to accommodate a standard cleaning 1 (SC1) solution, and a fourth tank configured to accommodate DI water. In actions S602 to S605, the plurality of wafers held by the cassette is cleaned in the cleaning tanks by cleaning agents through a batch process. Specifically, in action S602, the plurality of wafers are cleaned in the first tank by the $H_3PO_4$ solution or the LAL solution. In action S603, the plurality of wafers are rinsed in the second tank by DI water. In action S604, the plurality of wafers are cleaned in the third tank by the SC1 solution. In action S605, the plurality of wafers are rinsed in the fourth tank by DI water. In action S606, a replacement agent is provided into the fourth tank to replace the DI water on the surface of the plurality of wafers. In action S607, the cassette holding the plurality of wafers is removed from the fourth tank and rotated to allow the plurality of wafers to be horizontally loaded in the dipping tank. In action S608, the plurality of wafers are dipped in the replacement agent in the dipping tank. In action S609, the cassette is lifted by the robot hand to horizontally expose one of the wafers from the replacement agent. In action S610, the wafer covered by a layer of the replacement agent is transferred into the drying chamber of the cleaning apparatus. In action S611, the wafer is dried in the drying chamber by supercritical gas through a single wafer process. In action S612, the dried wafer is unloaded from the drying chamber.

In one implementation, the present disclosure is directed to a cleaning apparatus for semiconductor wafers. The cleaning apparatus includes a plurality of cleaning tanks, a dipping tank, a first robot hand, a second robot hand, and at least one drying chamber. The plurality of cleaning tanks is configured to clean a plurality of wafers held by a cassette by cleaning agents. The plurality of wafers is cleaned in the plurality of cleaning tanks through batch process. The dipping tank is configured to rinse the plurality of wafers by a replacement agent. The first robot hand is configured to transfer the cassette among the cleaning tanks and the dipping tank and lift the cassette from the dipping tank. The second robot hand is configured to take one of the wafers from the cassette when the cassette is lifted from the dipping tank. The at least one drying chamber is configured to dry the wafer taken by the second robot hand with a single wafer process.

As described above, the method and cleaning apparatus of the implementations of the present disclosure combines batch process and single wafer process to clean semiconductor wafers. Also, the wafers are dipped in an isopropyl alcohol (IPA) dipping tank at the end of the batch process to allow the wafer to be covered by a layer of IPA before being transferred into a drying chamber. Therefore, no additional IPA spray process from an IPA nozzle is required to prevent wafer cracking. The method and cleaning apparatus of the implementations of the present disclosure have improved processing rate and the performance of cleaning semiconductor wafers.

BRIEF DESCRIPTION OF THE DRAWINGS

Implementations of the present technology will now be described, by way of example only, with reference to the attached figures.

DETAILED DESCRIPTION

The present disclosure will now be described more fully hereinafter with reference to the accompanying drawings, in which example implementations of the disclosure are shown. This disclosure may, however, be embodied in many different forms and should not be construed as limited to the example implementations set forth herein. Rather, these example implementations are provided so that this disclosure will be thorough and complete, and will fully convey the scope of the disclosure to those skilled in the art. Like reference numerals refer to like elements throughout.

The terminology used herein is for the purpose of describing particular example implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the example implementations of the present disclosure in conjunction with the accompanying drawings in FIGS. 1 to 7. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

Figure 1:
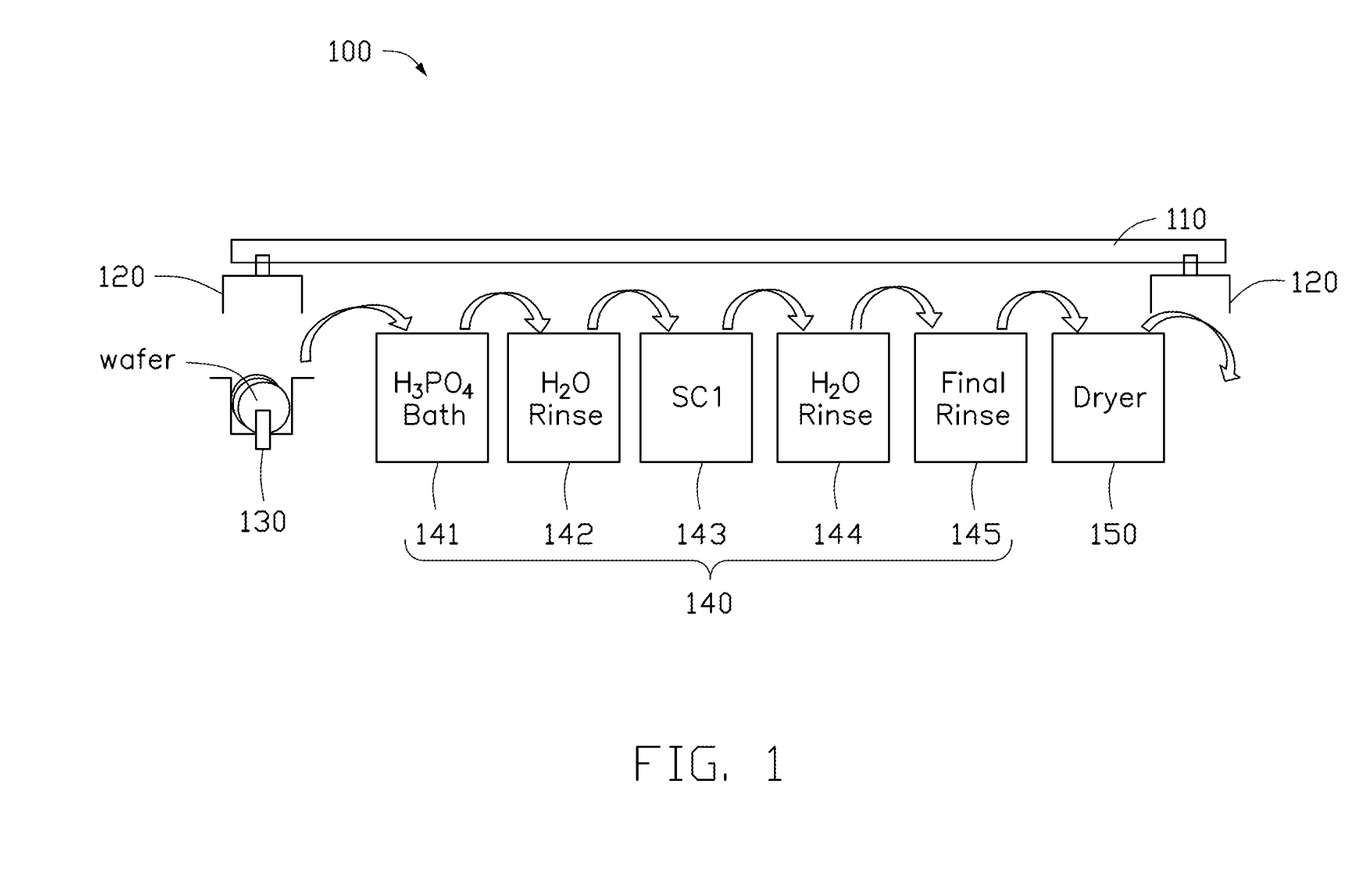
FIG. 1 is a schematic diagram of a batch cleaning apparatus for semiconductor wafers according to a first implementation of the present disclosure.
Figure 2:
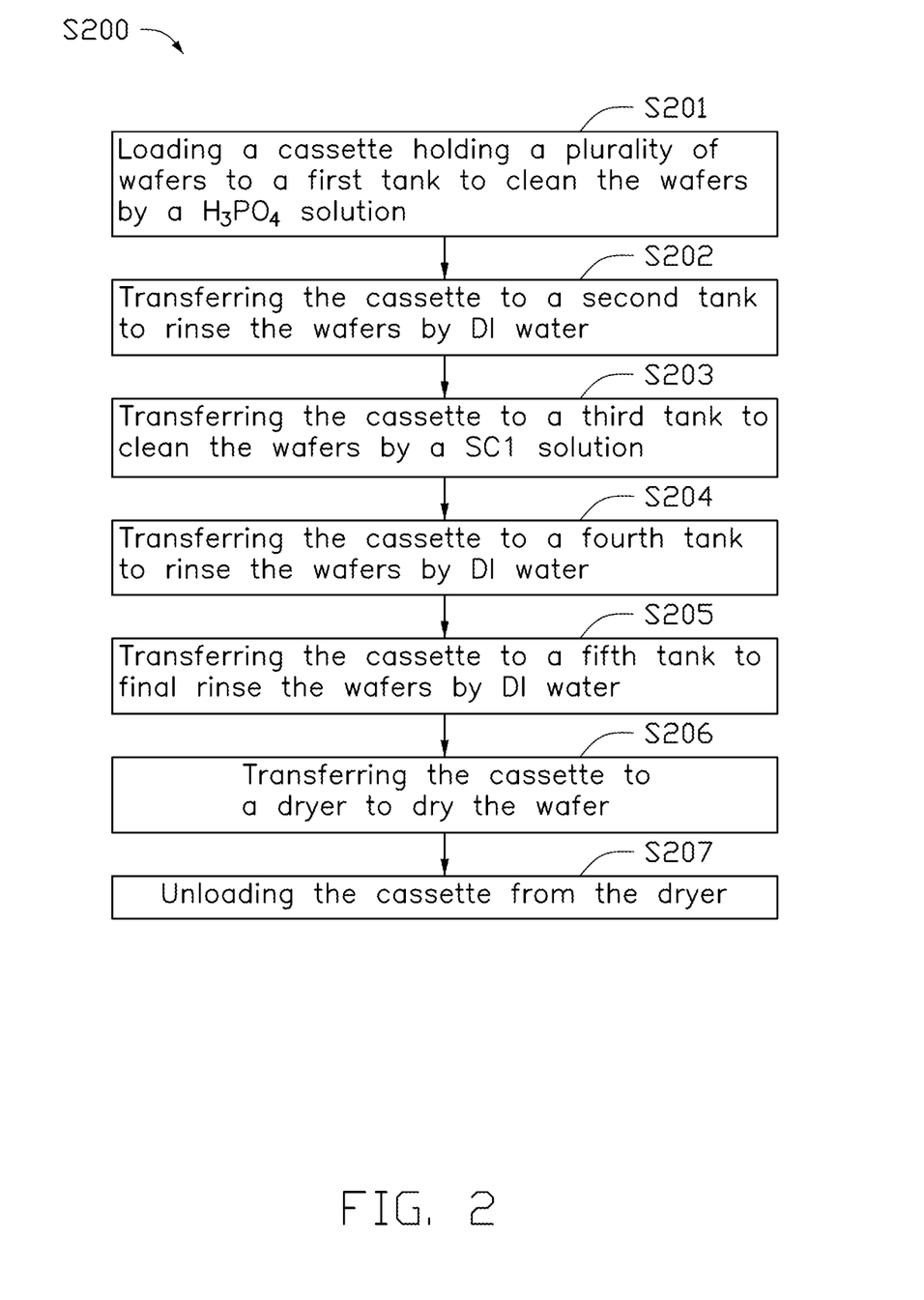
FIG. 2 is a flowchart of a batch cleaning method for semiconductor wafers according to a second implementation of the present disclosure.

Referring to FIG. 1 and FIG. 2, a schematic diagram a batch cleaning apparatus 100 and a flowchart of a batch cleaning method S200 for semiconductor wafers according to a first and a second implementations of the present disclosure are illustrated. As shown in FIG. 1, the batch cleaning apparatus 100 includes a plurality of cleaning tanks 140 for cleaning a plurality of wafers in a batch. In the first implementation, the batch cleaning apparatus 100 includes a first tank 141 configured to clean the wafers with a $H_3PO_4$ solution, a second tank 142 configured to rinse the wafers with deionized water (DI water), a third tank 143 configured to clean the wafers with a Standard Clean 1 (SC1) solution (i.e., a mixture solution of $NH_4OH$ and $H_2O_2$), a fourth tank 144 configured to rinse the wafers again with DI water, and a fifth tank 145 as a final rinse. At least one robot hand 120 is used to transfer a cassette 130 holding the plurality of wafers (preferably fifty wafers in one cassette) from tank to tank. The robot hand 120 moves along a guiding rail 110 to move the cassette 130. After the final rinse process by the fifth tank 145, the cassette 130 is transferred to a dryer 150 to dry the plurality of wafers.

As shown in FIG. 2, the batch cleaning method S200 includes actions S201 to S207. The batch cleaning method S200 of the second implementation is performed by the batch cleaning apparatus 100 of the first implementation in FIG. 1. In action S201, a cassette 130 holding a plurality of wafers is loaded by the robot hand 120 to the first tank 141 to clean the wafers by the $H_3PO_4$ solution. In action S202, the cassette 130 is transferred by the robot hand 120 to the second tank 142 to rinse the wafers by DI water. In action S203, the cassette 130 is transferred to the third tank 143 to clean the wafers by the SC1 solution. In action S204, the cassette 130 is transferred to the fourth tank 144 to rinse the wafers by DI water. In action S205, the cassette 130 is transferred to the fifth tank 145 to final rinse the wafers by DI water. In action S206, the cassette 130 is transferred by the robot hand 120 to the dryer 150 to dry the wafers. In action S207, the robot hand 120 unloads the cassette 130 from the dryer 150.

Figure 3:
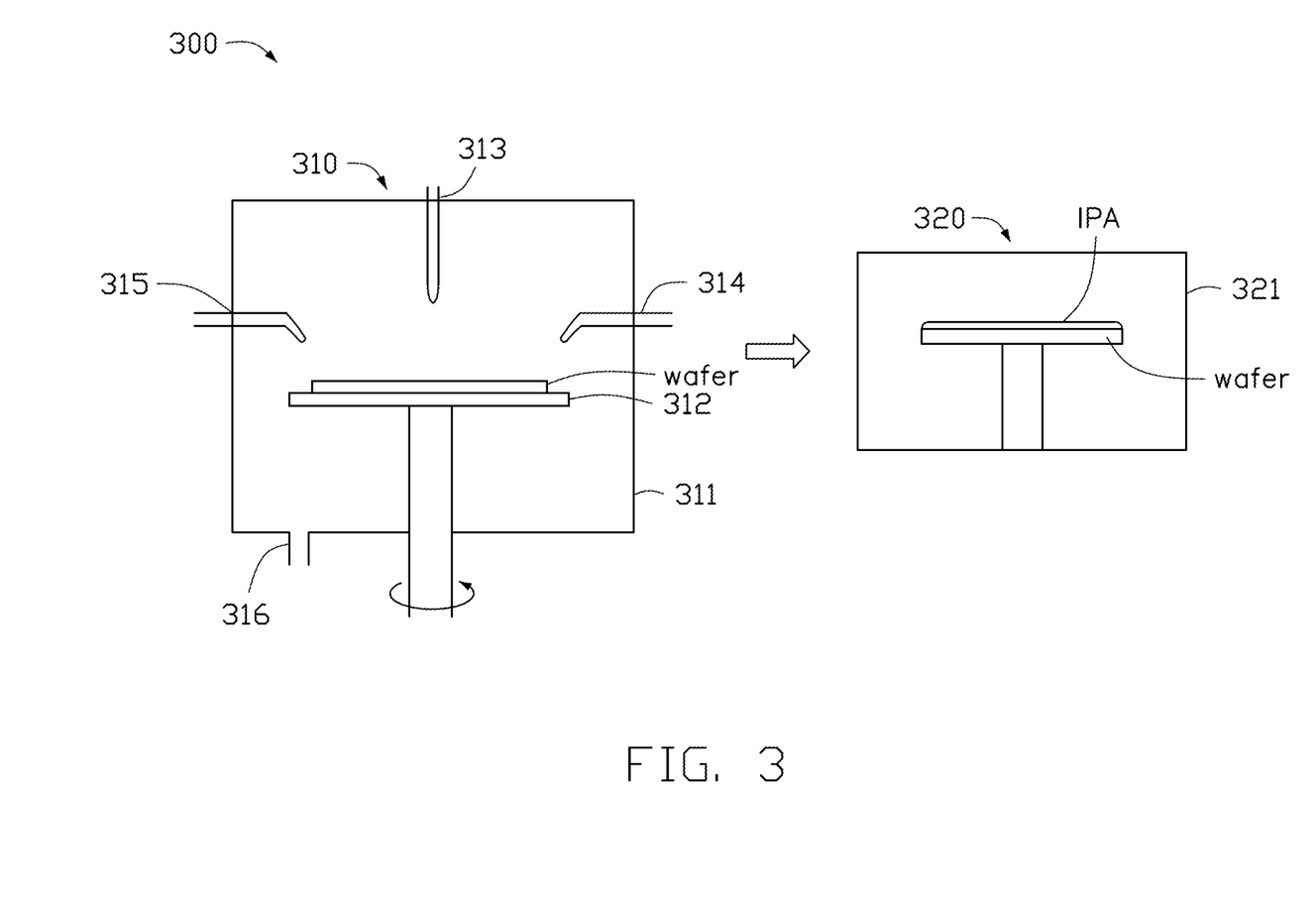
FIG. 3 is a schematic diagram of a single wafer cleaning apparatus for semiconductor wafers according to a third implementation of the present disclosure.
Figure 4:
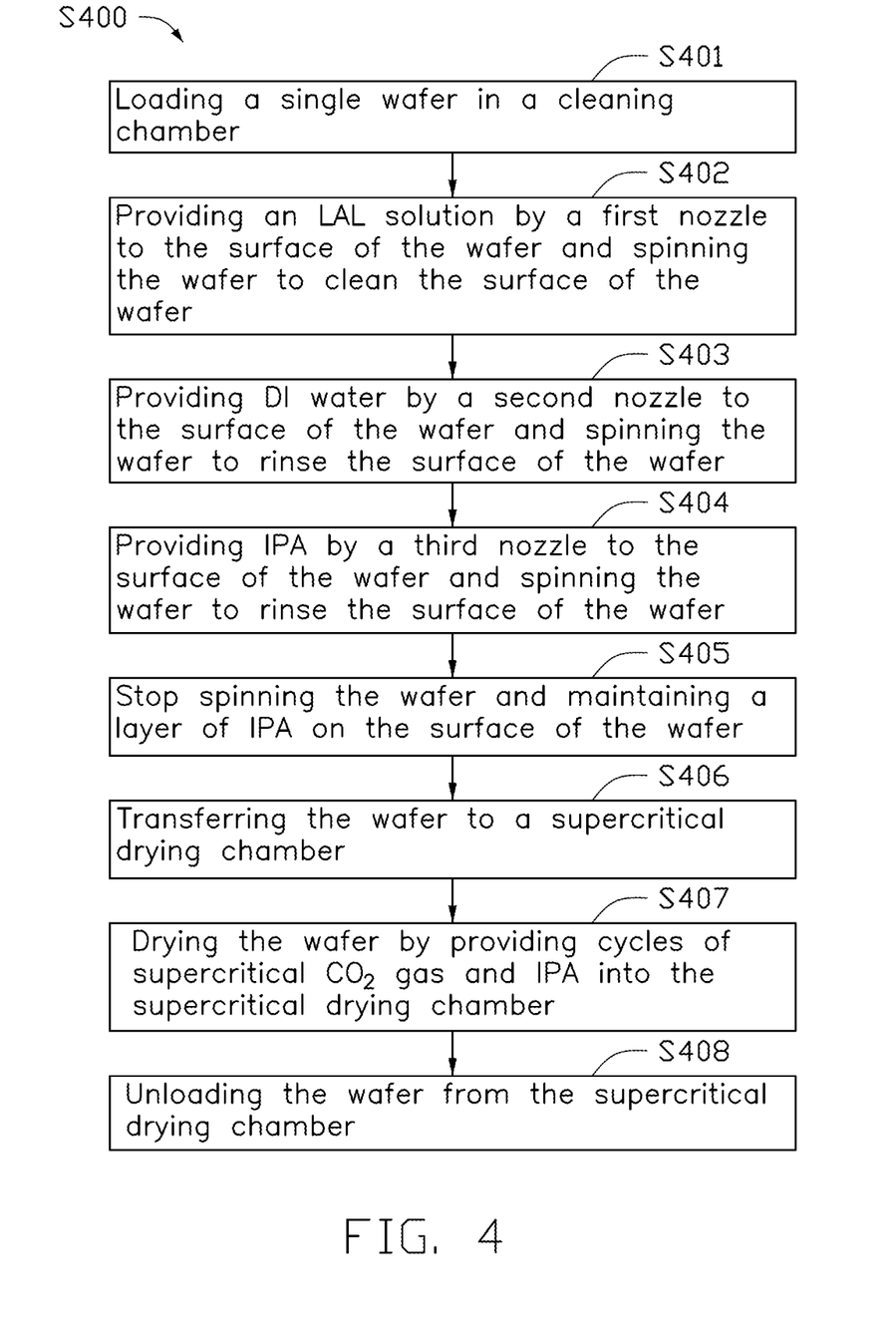
FIG. 4 is a flowchart of a single wafer cleaning method for semiconductor wafers according to a fourth implementation of the present disclosure.

Referring to FIG. 3 and FIG. 4, a schematic diagram of a single wafer cleaning apparatus 300 and a flowchart of a single wafer cleaning method S400 for semiconductor wafers according to a third and a fourth implementations of the present disclosure are illustrated. As shown in FIG. 3, the single wafer cleaning apparatus 300 of the third implementation includes a cleaning module 310 and a drying module 320. The cleaning module 310 is provided with cleaning chamber 311 having a rotatable stage 312 (such as a chuck) for maintaining a wafer in the cleaning chamber 311. Above the rotatable stage 312, there are provided a first nozzle 313 configured to supply a low ammonium fluoride liquid solution (LAL solution, which is a mixture solution of HF and $NH_4F$) to clean the wafer, a second nozzle 314 configured to supply DI water to rinse the wafer, and a third nozzle 315 configured to supply isopropyl alcohol (IPA) to an upper surface of the wafer. There is also provided a waste liquid drain 316 on the bottom of the cleaning chamber 311. From the waste liquid drain 316, liquid chemical or DI water supplied to the surface of the wafer is discharged. After the IPA rinse process, the wafer coated with a layer IPA solution is transferred to the drying module 320. The layer of IPA solution on the surface of the wafer is used to prevent wafer from cracking during the transfer process. The drying module 320 includes a drying chamber 321 (such as a supercritical drying chamber). In the drying chamber 321, the wafer is dried by cycles of supercritical fluid of $CO_2$ and IPA. After the wafer is dried, the wafer is then unloaded from the drying chamber 321.

As shown in FIG. 4, the single wafer cleaning method S400 includes actions S401 to S408. The single wafer cleaning method S400 of the fourth implementation is performed by the single wafer cleaning apparatus 300 of the third implementation in FIG. 3. In action S401, a single wafer is loaded in the cleaning chamber 311. In action S402, the first nozzle 313 provides the LAL solution to the surface of the wafer, and the surface of the wafer is cleaned by spinning the wafer. In action S403, the second nozzle 314 provides DI water to the surface of the wafer, and the surface of the wafer is rinsed by spinning the wafer. In action S404, the third nozzle 315 provides IPA to the surface of the wafer, and the surface of the wafer is rinsed by spinning the wafer. In action S405, stop spinning the wafer, a layer of IPA is maintained on the surface the wafer. In action S406, the wafer is transferred to the drying chamber 321 (i.e., the supercritical drying chamber). In action S407, the wafer is dried by providing cycles of supercritical $CO_2$ gas and IPA into the drying chamber 321. In action S408, the wafer is unloaded from the drying chamber 321.

Figure 5:
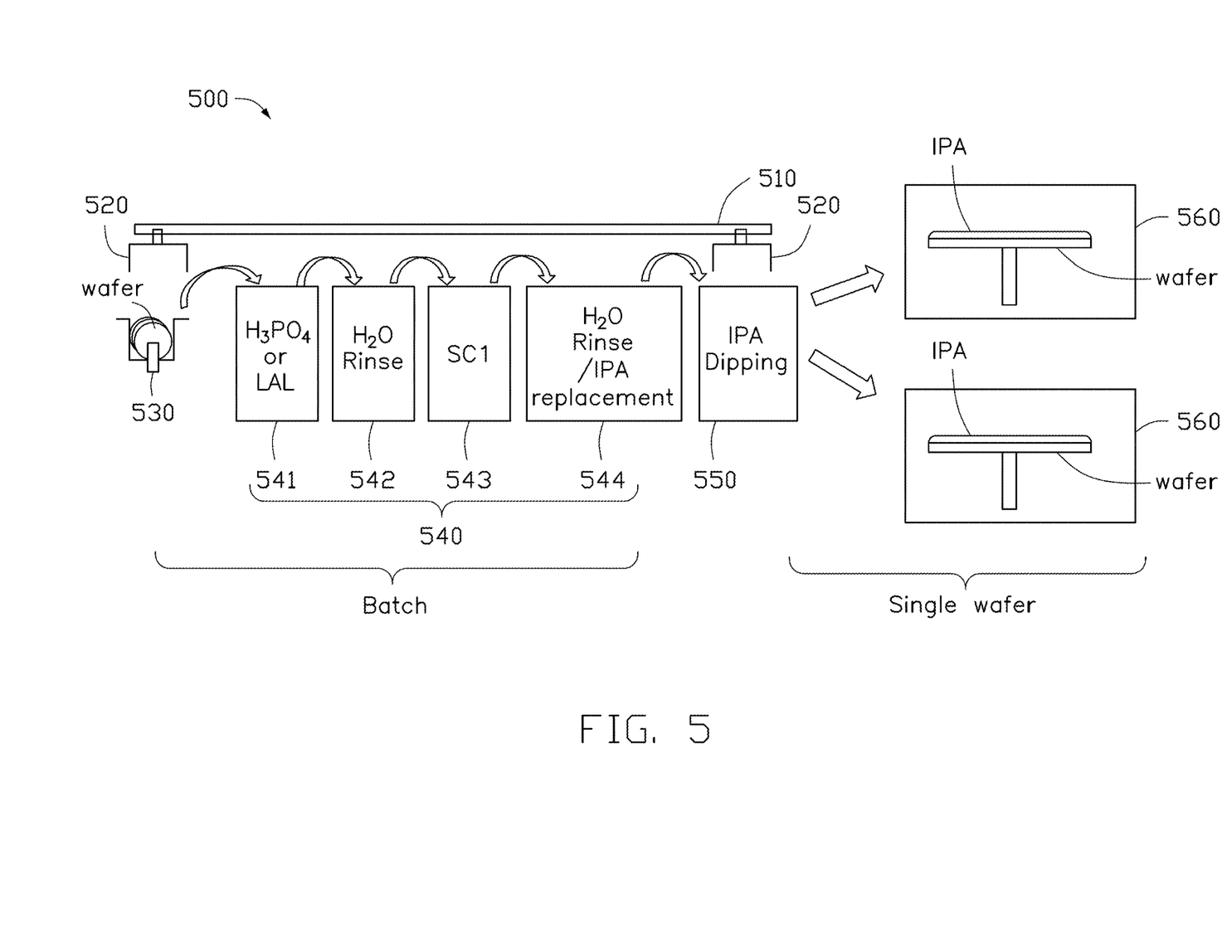
FIG. 5 is a schematic diagram of a cleaning apparatus for semiconductor wafers according to a fifth implementation of the present disclosure.
Figure 6:
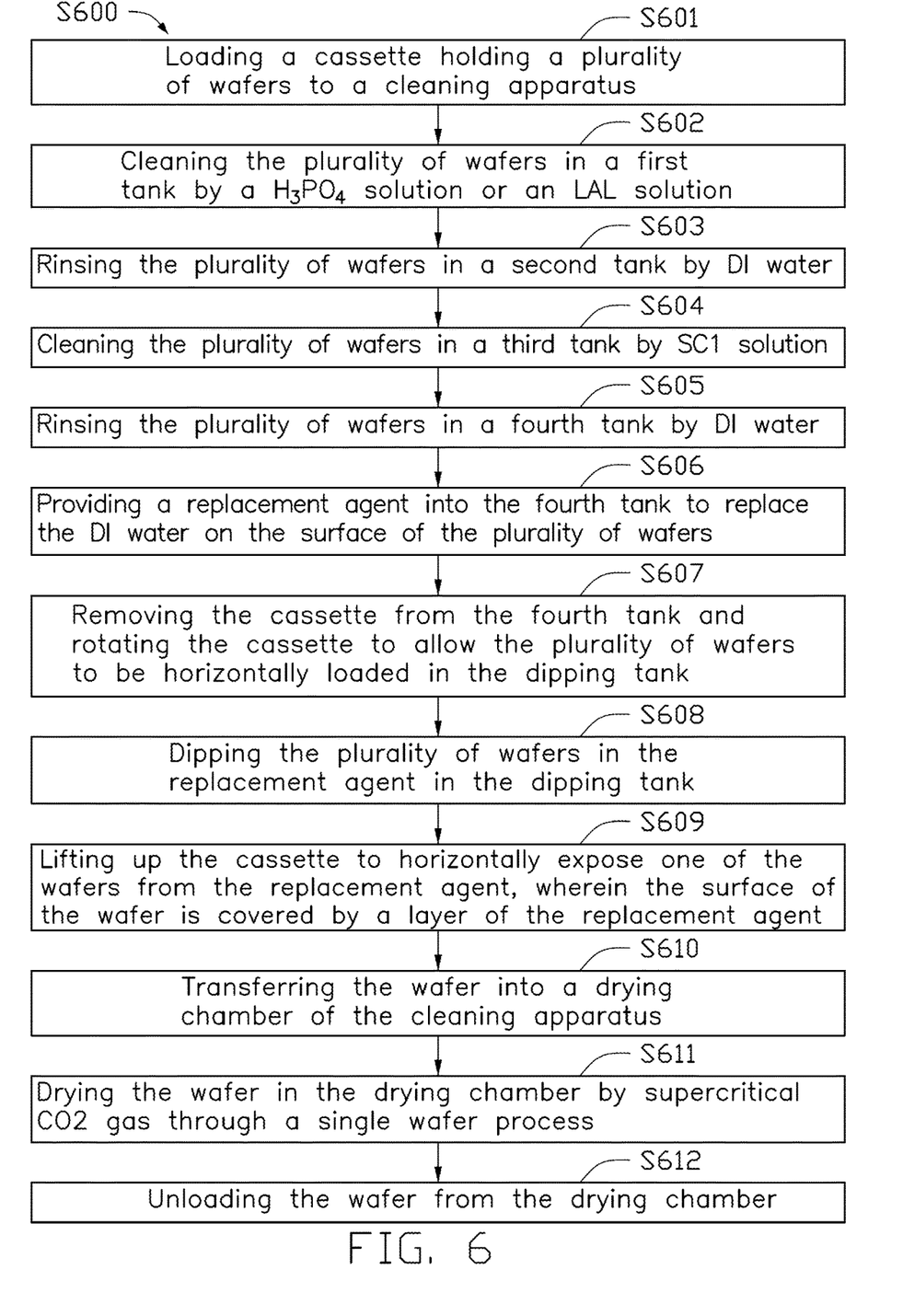
FIG. 6 is a flowchart of a method of cleaning semiconductor wafers according to a sixth implementation of the present disclosure.
Figure 7:
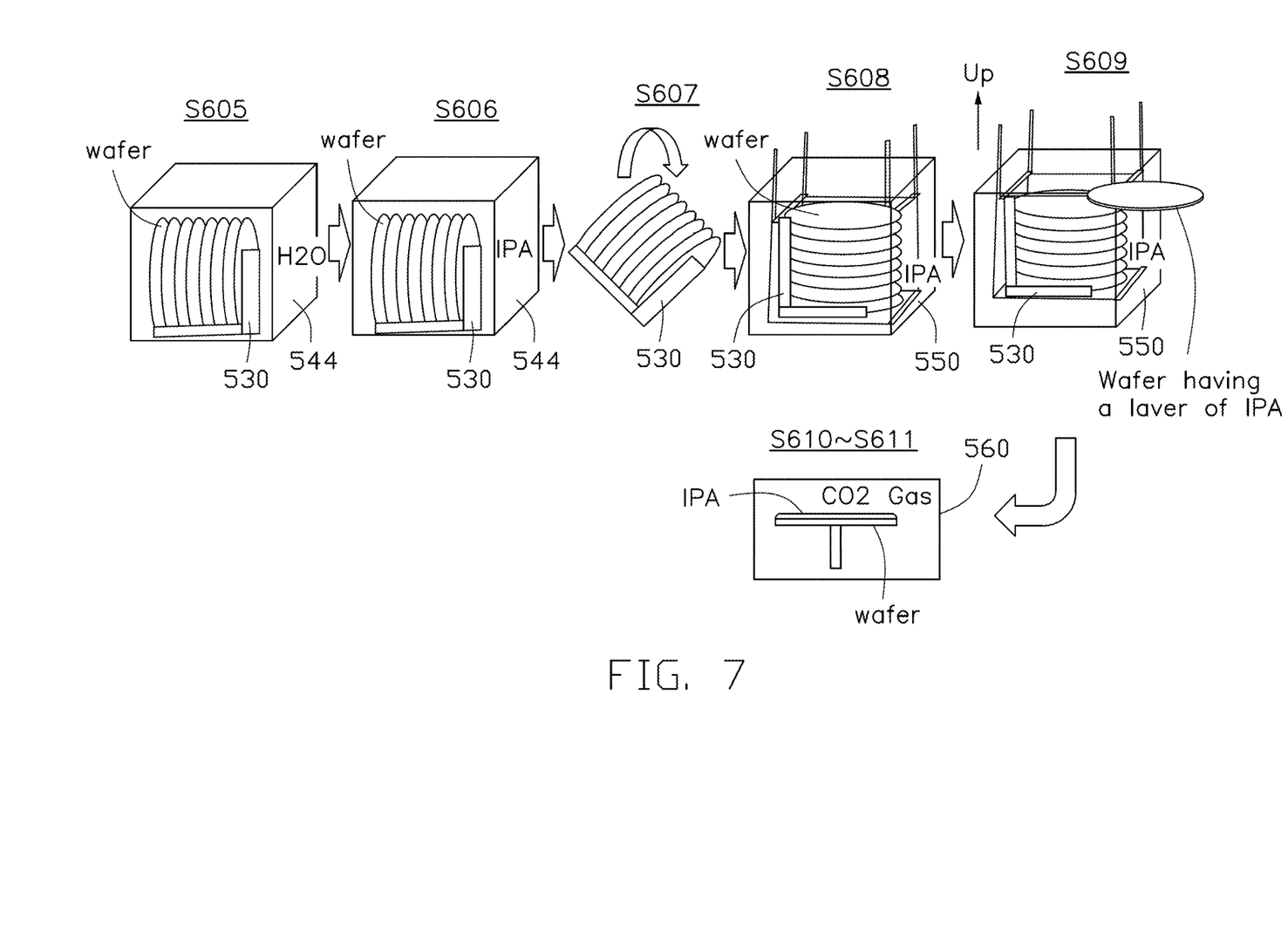
FIG. 7 is a schematic diagram showing the actions of the method of the sixth implementation in FIG. 6.

Referring to FIGS. 5 to 6, a schematic diagram of a cleaning apparatus 500 and a flowchart of a method S600 of cleaning semiconductor wafers according to a fifth implementation and a sixth implementation of the present disclosure are illustrated. Referring to FIG. 7, a schematic diagram showing the actions of the method S600 of the sixth implementation in FIG. 6 is illustrated. As shown in FIG. 5, the cleaning apparatus 500 includes a plurality of cleaning tanks 540, a dipping tank 550, and at least one drying chamber 560. The cleaning tanks 540 is configured to accommodate cleaning agents for cleaning a plurality of wafers (preferably 50 wafers as one batch) held by a cassette 530. The cleaning agents may be, for example, a Standard Cleaning 1 (SC1) solution, a Buffered Oxide Etch (BOE) solution, a low ammonium fluoride liquid (LAL) solution, a $H_3PO_4$ solution, or a Sulfuric Peroxide Mixture (SPM) solution. In this implementation, the cleaning tanks 540 includes a first tank 541 configured to accommodate a $H_3PO_4$ solution or an LAL solution, a second tank 542 configured to accommodate DI water, a third tank 543 configured to accommodate a SC1 solution, and a fourth tank 544 configured to accommodate DI water. The fourth tank 544 may be also configured to perform a replacement process of replacing the water on the surface of the wafers by adding a replacement agent. The dipping tank 550 is configured to accommodate a replacement agent for rinsing the plurality of wafers. In this implementation, the replacement agent is isopropyl alcohol (IPA). The drying chamber 560 can be a supercritical drying chamber which dries one wafer at a time by cycles of supercritical $CO_2$ and IPA. When transferring the wafer to the drying chamber 560, the surface of the wafer is covered by a layer of IPA to prevent wafer cracking during transferring and drying process. The cleaning apparatus 500 further includes a guiding rail 510 and at least one robot hand 520. The robot hand 520 is coupled to the guiding rail and configured to transfer the plurality of wafers along the guiding rail 510 (i.e., moving the cassette 530 holding the plurality of wafers among tanks 541 to 550).

In the first tanks 541 to 544, the cassette 530 is disposed in a way that the wafers are vertically disposed. Specifically, each of the wafers has an upper surface and a bottom surface, and the upper surface and the bottom surface of the wafers are vertically-orientated. When transferring the cassette 530 from the fourth tank 544 to the dipping tank 550, the cassette 530 is rotated by the robot hand 520 so that the wafers are horizontally loaded in the dipping tank 550. Specifically, the cassette 530 is rotated by the robot hand 520 for an angle of 90 degrees, so that the upper surface and the bottom surface of the wafers are horizontally-orientated. After dipping the wafers in the dipping tank 550 for IPA dipping, the cassette 530 is lifted up from the dipping tank 550 by the robot hand 520 for a height of one wafer-to-wafer interval to expose one of the wafers from the IPA. The wafer exposed from the IPA has a layer of IPA on its upper surface. Then, the wafer covered with a layer of IPA is transferred into the drying chamber 560 to dry the wafer by cycles of supercritical $CO_2$ and IPA. The layer of IPA on the surface of the wafer is necessary during the transferring and drying processes to prevent wafer cracking. As shown in FIG. 5, the processes in the tanks 541 to 544 are batch processes, the process in the dipping tank 550 is switched from batch process to single wafer process, and the process in the drying chamber 560 is single wafer process.

As shown in FIG. 6, the method S600 for cleaning semiconductor wafer includes actions S601 to S612. The method S600 may be performed by the cleaning apparatus 500 in FIG. 5. FIG. 7 are schematic diagrams of the actions of the method S600.

In action S601, a cassette 530 holding a plurality of wafers is loaded to a cleaning apparatus 500. The cleaning apparatus includes a plurality of cleaning tanks 540, a dipping tank 550, and at least one drying chamber 560. The plurality of cleaning tanks 540 are configured to accommodate cleaning agents for cleaning the wafers. As shown in FIG. 5, the plurality of cleaning tanks 540 include a first tank 541 configured to accommodate $H_3PO_4$ solution or LAL solution, a second tank 542 configured to accommodate DI water, a third tank 543 configured to accommodate SC1 solution, and a fourth tank 544 configured to accommodate DI water. The cleaning apparatus 500 further includes a guiding rail 510 and at least one robot hand 520. The robot hand 520 is coupled to the guiding rail 510 and configured to transfer the plurality of wafers along the guiding rail 510.

In actions S602 to S605, the plurality of wafers held by the cassette 530 is cleaned in the cleaning tanks 540 by using cleaning agents through a batch process. During the cleaning process, the plurality of wafers are vertically disposed in the plurality of cleaning tanks 540. Specifically, in actions S602, the plurality of wafers are cleaned in the first tank 541 by the $H_3PO_4$ solution or the LAL solution. In action S603, the plurality of wafers are rinsed in the second tank 542 by DI water. In action S604, the plurality of wafers are cleaned in the third tank 543 by the SC1 solution. In action S605, the plurality of wafers are rinsed in the fourth tank 544 by DI water, as shown in action S605 in FIG. 7.

In action S606, a replacement agent is provided into the fourth tank 544 to replace the DI water on the surface of the plurality of wafers. The replacement agent is IPA. In action S606, IPA is added into the fourth tank 544 to replace the DI water on the surface of the plurality of wafers, as shown in action S606 in FIG. 7. In actions S602 to S606, the plurality of wafers held by the cassette 530 remains vertically disposed in the cleaning tanks 540.

In action S607, the cassette 530 holding the plurality of wafers is removed from the fourth tank 544 and rotated to allow the plurality of wafers to be horizontally loaded in the dipping tank 550, as shown in action S607 in FIG. 7. In action S607, the cassette 530 is rotated by the robot hand 520 for an angel of 90 degrees to allow the wafers to be horizontally disposed.

In action S608, the plurality of wafers are dipped in the replacement agent in the dipping tank 550. The replacement agent is IPA. As show in action S608 in FIG. 7, the plurality of wafers held by the cassette 530 is horizontally disposed in the dipping tank 550.

In action S609, the cassette 530 is lifted by the robot hand 520 to horizontally expose one of the wafers from the replacement agent of the dipping tank 550, as shown in action S609 in FIG. 7. The surface of the wafer exposed from the replacement agent is covered by a layer of the replacement agent. Specifically, the cassette 530 is lifted for a height of one wafer-to-wafer interval to expose one of the wafers from the replacement agent. Alternatively, the cassette 530 can also be lifted for a height of two wafer-to-wafer intervals to expose two wafers from the replacement agent. After the wafer on the top is removed, the cassette 530 is then lowered to dip the other wafer in the replacement agent. By lifting the cassette 530 for a height of two wafer-to-wafer intervals, the robot hand 520 can grab the wafer on the top without touching the replacement agent in the dipping tank 550. Since the wafer is horizontally exposed from the replacement agent (e.g., IPA), the wafer maintains a layer of IPA on its upper surface. Therefore, no additional IPA spraying process by an IPA nozzle is required to wet the surface of the wafer compared to a single wafer process, since the wafer already is coated a layer of IPA from the dipping tank 550. In action S609, the method S600 is changed from a batch process to a single wafer process.

In action S610, the wafer covered by a layer of IPA is transferred into the drying chamber 560 of the cleaning apparatus 500. The drying chamber 560 can be a supercritical drying chamber which using supercritical gas to dry the wafer. In action S611, the wafer is dried in the drying chamber 560 by supercritical gas through single wafer process, as shown in FIG. 7. Preferably, the wafer is dried in the drying chamber 560 by supercritical $CO_2$. Alternatively, the wafer is dried in the drying chamber 560 by cycles of supercritical $CO_2$ and IPA. In action S612, the dried wafer is unloaded from the drying chamber 560. In actions S610 to S612, the method S600 is a single wafer process.

The present disclosure also is directed to a cleaning apparatus for semiconductor wafers. The cleaning apparatus can be referred to the cleaning apparatus 500 in FIG. 5 and the fifth and sixth implementations. The cleaning apparatus 500 includes a plurality of cleaning tanks 540, a dipping tank 550, at least one robot hand 520, and at least one drying chamber 560. The plurality of cleaning tanks 540 are configured to clean a plurality of wafers held by a cassette 530 by cleaning agents. The plurality of wafers are cleaned in the plurality of cleaning tanks 540 through a batch process. As shown in FIG. 5, the plurality of cleaning tanks 540 include a first tank 541 configured to accommodate a $H_3PO_4$ solution or an LAL solution, a second tank 542 configured to accommodate DI water, a third tank 543 configured to accommodate a SC1 solution, and a fourth tank 544 configured to accommodate DI water. The fourth tank 544 is further configured to receive the replacement agent to replace the DI water on the surface of the plurality of wafers. The plurality of wafers held by the cassette 530 is vertically disposed in the cleaning tanks 540. The dipping tank 550 is configured to rinse the plurality of wafers by a replacement agent. Preferably, the replacement agent is IPA.

As shown in FIG. 5, the cleaning apparatus 500 includes two robot hands 520, a first robot hand, and a second robot hand. The cleaning apparatus 500 further includes a guiding rail 510. The first robot hand and the second robot hand are coupled to the guiding rail 510 and moving along the guiding rail 510. The first robot hand 520 is configured to transfer the cassette among the cleaning tanks 540 and the dipping tank 550. The plurality of wafers held by the cassette 530 is vertically disposed in the cleaning tanks 540. When transferring the cassette 530 from the cleaning tanks 540 to the dipping tank 550, the first robot hand is configured to rotate the cassette 530 to allow the plurality of wafers to be horizontally loaded in the dipping tank 550. Also, the first robot hand 520 is configured to lift the cassette 530 from the dipping tank 550. The first robot hand 520 is configured to lift the cassette 530 by a height of one wafer-to-wafer interval to expose one of the wafers from the replacement agent of the dipping tank 550. A surface of the wafer exposed from the replacement agent is covered by a layer of the replacement agent to prevent wafer cracking during transferring to the drying chamber 560. The second robot hand is configured to take one of the wafers from the cassette 530 when the cassette 530 is lifted from the dipping tank 550.

The drying chamber 560 is configured to dry the wafer taken by the second robot hand through single wafer process. The drying chamber 560 is a supercritical drying chamber configured to dry the wafer by supercritical $CO_2$. Preferably, the wafer is dried by cycles of supercritical $CO_2$ and IPA.

As described above, the method and cleaning apparatus of the implementations of the present disclosure combine batch process and single wafer process to clean semiconductor wafers. Also, the wafers are dipped in an IPA dipping tank at the end of the batch process to allow the wafer to be covered by a layer of IPA before being transferred into a drying chamber. Therefore, no additional IPA spray process from an IPA nozzle is required to prevent wafer cracking. The method and cleaning apparatus of the implementations of the present disclosure have improved processing rate and the performance of cleaning semiconductor wafers.

The implementations shown and described above are only examples. Many details are often found in the art such as the other features of a polyurethane polishing pad and a composition for manufacturing the same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the implementations described above may be modified within the scope of the claims.

What is claimed is:

1. A method of cleaning semiconductor wafers, the method comprising:
loading a cassette holding a plurality of wafers to a cleaning apparatus, wherein the cleaning apparatus comprises a plurality of cleaning tanks configured to accommodate cleaning agents for cleaning the wafers, a dipping tank configured to accommodate a replacement agent for rinsing the wafers, and at least one drying chamber configured to dry the wafers;
cleaning the plurality of wafers held by the cassette sequentially in the plurality of cleaning tanks by using cleaning agents, wherein the plurality of wafers are vertically disposed in the plurality of cleaning tanks;
sequentially removing the cassette from the plurality of cleaning tanks and rotating the cassette to allow the plurality of wafers to be horizontally loaded in the dipping tank of the cleaning apparatus;
dipping the plurality of wafers in the replacement agent in the dipping tank;
lifting up the cassette to expose one of the wafers from the replacement agent, wherein the one of the wafers is horizontally disposed in the dipping tank, and a surface of the one of the wafers is covered by a layer of the replacement agent; and
transferring the one of the wafers into the drying chamber of the cleaning apparatus.

2. The method of claim 1, wherein the plurality of cleaning tanks comprises a first tank configured to accommodate a $H_3PO_4$ solution or a low ammonium fluoride liquid (LAL) solution, a second tank configured to accommodate deionized (DI) water, a third tank configured to accommodate a standard cleaning 1 (SC1) solution, and a fourth tank configured to accommodate the DI water.

3. The method of claim 2, wherein the cleaning the plurality of wafers further comprises: cleaning the plurality of wafers in the first tank by the $H_3PO_4$ solution or the LAL solution; rinsing the plurality of wafers in the second tank by the DI water; cleaning the plurality of wafers in the third tank by the SC1 solution; and rinsing the plurality of wafers in the fourth tank by the DI water.

4. The method of claim 3, further comprising: providing the replacement agent into the fourth tank to replace the DI water on the surface of the plurality of wafers after the plurality of wafers in the fourth tank is rinsed by the DI water.

5. The method of claim 4, wherein the replacement agent is isopropyl alcohol (IPA).

6. The method of claim 1, further comprising: drying the wafer in the drying chamber by a supercritical fluid through a single wafer process after the wafer is transferred into the drying chamber of the cleaning apparatus.

7. The method of claim 6, wherein the supercritical fluid is supercritical $CO_2$.

8. The method of claim 6, further comprising: unloading the wafer from the drying chamber after the wafer is dried.

9. The method of claim 1, wherein the cleaning apparatus further comprises a guiding rail and at least one robot hand, the robot hand is coupled to the guiding rail and configured to transfer the plurality of wafers along the guiding rail.

* * * * *

UNITED STATES PATENT AND TRADEMARK OFFICE
CERTIFICATE OF CORRECTION

PATENT NO. : 11,342,204 B2  
APPLICATION NO. : 16/668395  
DATED : May 24, 2022  
INVENTOR(S) : Chang-Hyeon Nam and Injoon Yeo

Page 1 of 1

It is certified that error appears in the above-identified patent and that said Letters Patent is hereby corrected as shown below:

On the Title Page

Please add Item (60) regarding "Related U.S. Application Data":  
Related U.S. Application Data  
(60) Provisional application No. 62/779,496, filed on Dec. 14, 2018

Signed and Sealed this  
Fourth Day of October, 2022

Katherine Kelly Vidal  
*Director of the United States Patent and Trademark Office*